(12) United States Patent
Slotboom et al.

(10) Patent No.: US 11,366,396 B2
(45) Date of Patent: Jun. 21, 2022

(54) METHOD AND APPARATUS FOR CONFIGURING SPATIAL DIMENSIONS OF A BEAM DURING A SCAN

(71) Applicant: ASML NETHERLANDS B.V., Veldhoven (NL)

(72) Inventors: Daan Maurits Slotboom, Wolphaartsdijk (NL); Hermannes Theodorus Heijmerikx, Eindhoven (NL); Javier Augusto Loaiza Rivas, Eindhoven (NL); Jeroen Cottaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/268,177

(22) PCT Filed: Aug. 1, 2019

(86) PCT No.: PCT/EP2019/070748
§ 371 (c)(1),
(2) Date: Feb. 12, 2021

(87) PCT Pub. No.: WO2020/048693
PCT Pub. Date: Mar. 12, 2020

(65) Prior Publication Data
US 2021/0302843 A1 Sep. 30, 2021

(30) Foreign Application Priority Data

Sep. 3, 2018 (EP) .................................. 18192251
Jan. 9, 2019 (EP) .................................. 19150960

(51) Int. Cl.
*G03F 7/20* (2006.01)

(52) U.S. Cl.
CPC ...... *G03F 7/70358* (2013.01); *G03F 7/70258* (2013.01); *G03F 7/70625* (2013.01); *G03F 7/70633* (2013.01)

(58) Field of Classification Search
CPC ............. G03F 7/70358; G03F 7/70625; G03F 7/70633; G03F 7/70258; G03F 7/705; G03F 7/70616
See application file for complete search history.

(56) References Cited

U.S. PATENT DOCUMENTS 6,346,979 B1 * 2/2002 Ausschnitt .......... G03F 7/70358
355/53
6,952,253 B2 10/2005 Lof et al.
(Continued)

FOREIGN PATENT DOCUMENTS

EP 1037266 9/2000
JP H11195602 7/1999
(Continued)

OTHER PUBLICATIONS

International Search Report and Written Opinion issued in corresponding PCT Patent Application No. PCT/EP2019/070748, dated Nov. 6, 2019.
(Continued)

*Primary Examiner* — Mesfin T Asfaw
(74) *Attorney, Agent, or Firm* — Pillsbury Winthrop Shaw Pittman LLP

(57) ABSTRACT

A method of configuring a step of scanning a beam of photons or particles across a patterning device for exposing a pattern onto a substrate, wherein the method includes determining a spatial resolution of a patterning correction configured to improve quality of the exposing, and determining a spatial dimension of the beam based on the determined spatial resolution of the patterning correction.

20 Claims, 5 Drawing Sheets

(56) References Cited

U.S. PATENT DOCUMENTS

| | | |
|---|---|---|
| 2007/0263190 A1 | 11/2007 | De Boeij et al. |
| 2008/0128642 A1 | 6/2008 | Mos et al. |
| 2008/0220345 A1 | 9/2008 | Van De Kerkhof et al. |
| 2011/0216294 A1 | 9/2011 | Menchtchikov et al. |

FOREIGN PATENT DOCUMENTS

| | | |
|---|---|---|
| JP | 2008147654 | 6/2008 |
| JP | 2008219010 | 9/2008 |
| JP | 2010074043 | 4/2010 |
| JP | 2012043906 | 3/2012 |
| JP | 2013520019 | 5/2013 |
| WO | 2011101183 | 8/2011 |
| WO | 2016128190 | 8/2016 |
| WO | 2018121921 | 7/2018 |

OTHER PUBLICATIONS

Japanese Office Action issued in corresponding Japanese Patent Application No. 2021-512259, dated Apr. 5, 2022.

\* cited by examiner

METHOD AND APPARATUS FOR CONFIGURING SPATIAL DIMENSIONS OF A BEAM DURING A SCAN

CROSS-REFERENCE TO RELATED APPLICATIONS

This application is the U.S. national phase entry of PCT Patent Application No. PCT/EP2019/070748 which was filed on Aug. 1, 2019, which claims the benefit of priority of European Patent Application No. 18192251.9 which was filed on Sep. 3, 2018 and European Patent Application No. 19150960.3 which was filed on Jan. 9, 2019, each of which is incorporated herein in its entirety by reference.

FIELD

The present invention relates to methods and apparatus for exposing patterns using radiation. Specifically, it relates to methods and apparatus of scanning a beam of photons or particles across a patterning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

A beam of radiation used by a lithographic apparatus may not cover the entirety of a patterning device at the same time. In order to project a pattern onto a substrate, the beam of radiation may therefore be scanned across a patterning device. Properties of the patterning device, the substrate, and the radiation beam may all contribute to the characteristics of the resulting pattern. Optimization of several of these properties in order to achieve an exposure resulting in a pattern matching the intended design may include optimization of properties relating to the radiation beam itself.

SUMMARY

According to an aspect of the invention there is provided a method of configuring a step of scanning a beam of photons or particles across a patterning device for exposing a pattern onto a substrate, wherein the method comprises determining a spatial resolution of a patterning correction configured to improve quality of the exposing, and determining a spatial dimension of the beam based on the determined spatial resolution of the patterning correction.

Optionally, the configuring of the step is undertaken in a lithographic apparatus.

Optionally, the patterning correction comprises a correction to mitigate the effects of one or more of alignment, overlay, critical dimension, dose, and focus.

Optionally, the patterning correction is determined based on one or more measurements undertaken on a further substrate.

Optionally, a beam cross-section defines a slit at the patterning device.

Optionally, the beam is passed through an exposure slit area for forming the shape of the slit.

Optionally, the spatial dimension of the beam is associated with a length of the slit in a direction of the scanning.

Optionally, the spatial dimension of the beam is indirectly proportional to the spatial resolution of the patterning correction.

Optionally, the length of the slit S and the spatial resolution C of the patterning correction are related according to $S^2 + C^2 \leq 1.1\ C^2$.

Optionally, the patterning device comprises a plurality of dies to be exposed to the substrate at a plurality of locations, wherein the spatial resolution of the patterning correction is smaller than a dimension of a die of the plurality of dies.

Optionally, the patterning device comprises a mask or reticle.

Optionally, the spatial dimension of the beam is controlled by a beam block.

Optionally, the beam block comprises a plurality of moveable blades.

Optionally, the patterning device is located at an image plane of the beam, and the beam block is located in a conjugate plane of the image plane.

Optionally, the spatial dimension of the beam is adjusted using variable beam shaping optics.

Optionally, the method further comprises scanning the beam across a patterning device to expose the pattern onto the substrate.

Optionally, the method further comprises adjusting one or more properties of the beam to apply the patterning correction during scanning of the beam across the patterning device.

Optionally, scanning the beam across the pattering device comprises moving one of the patterning device and the beam relative to the other of the patterning device and the beam.

According to another aspect of the invention there is provided an electronic data carrier comprising instructions which, when executed on at least one processor, cause the at least one processor to control an apparatus to carry out a method as described herein.

According to another aspect of the invention there is provided an apparatus for configuring a step of scanning a beam of photons or particles across a patterning device for exposing a pattern onto a substrate, the apparatus comprising a processor configured to execute computer program code to undertake the method of determining a spatial resolution of a patterning correction configured to improve quality of the exposing, and determining a spatial dimension of the beam based on the determined spatial resolution of the patterning correction.

Optionally, there is provided an apparatus for use in semiconductor manufacture comprising the apparatus described above.

Optionally, there is provided a lithographic cell system comprising the apparatus for use in semiconductor manufacture.

According to another aspect of the invention there is provided an apparatus configured to obtain measurement data relating to one or more properties of a pattern exposed on a substrate, determine a spatial resolution of a patterning parameter of the pattern based on the measurement data, and determine a spatial dimension of a beam of photons or particles of a patterning device, based on the determined spatial resolution.

Optionally there is provided an apparatus for use in semiconductor manufacture comprising the apparatus described in the above paragraph.

Optionally, there is provided a lithographic cell system comprising the apparatus for use in semiconductor manufacture.

According to another aspect of the invention there is provided a method for determining positions of features within a functional area on a patterning device configured for use in a lithographic process, the method comprising: determining positions of the features within the functional area based at least partially on the dependency of a spatial characteristic of a process performed subsequently to the lithographic process on the positions of the features.

According to another aspect of the invention there is provided a patterning device comprising features positioned within the functional area using a method according to the previous aspect.

According to another aspect of the invention there is provided a method for determining a preferred orientation of a die with respect to another die on a patterning device configured for use in a process of patterning a substrate, the method comprising determining the preferred orientation of the die based on a topography of the substrate after executing the process of patterning.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
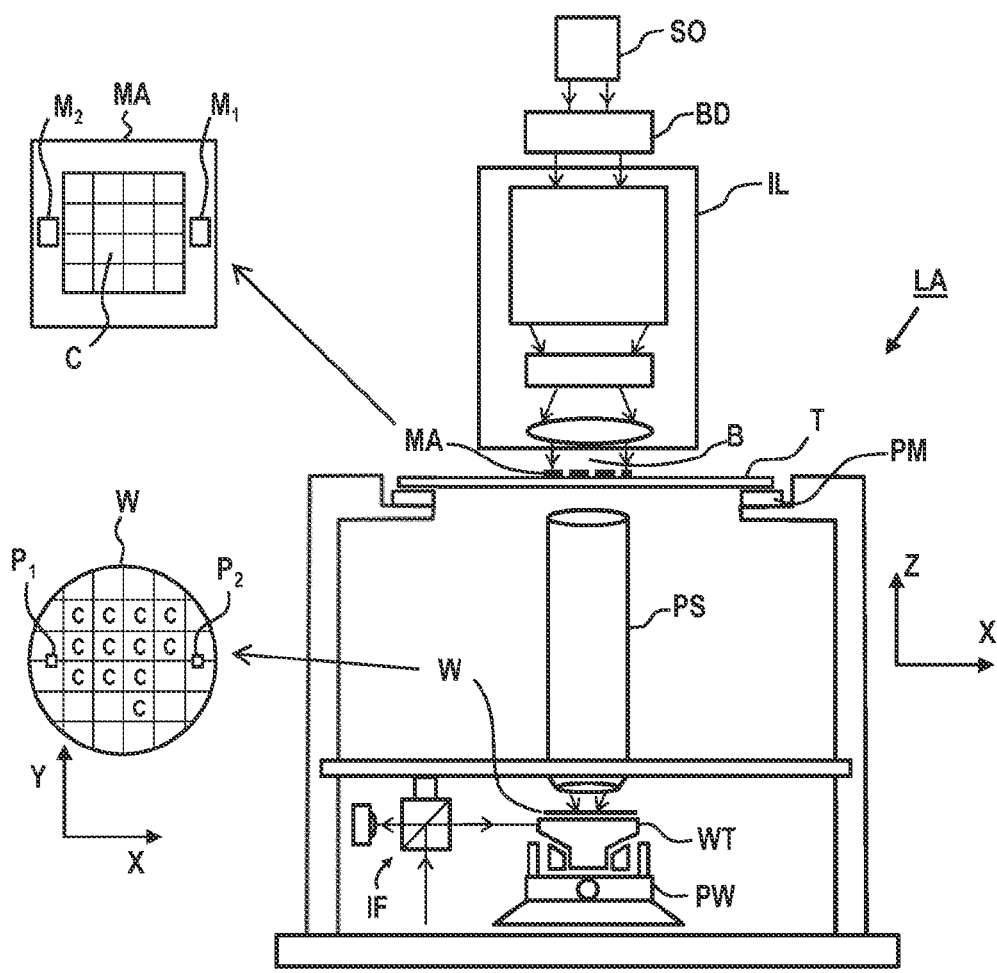
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
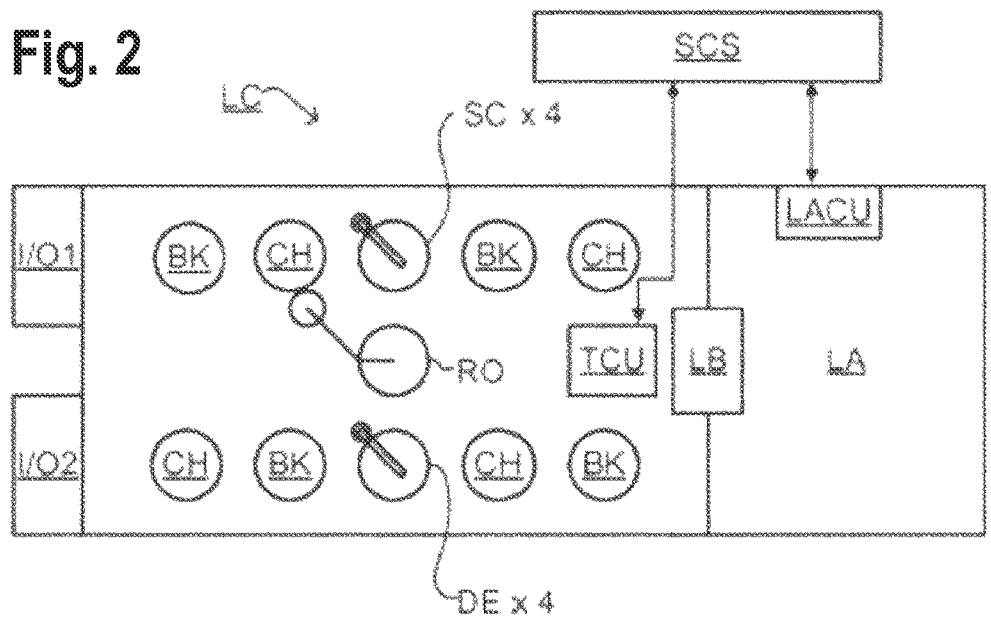
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
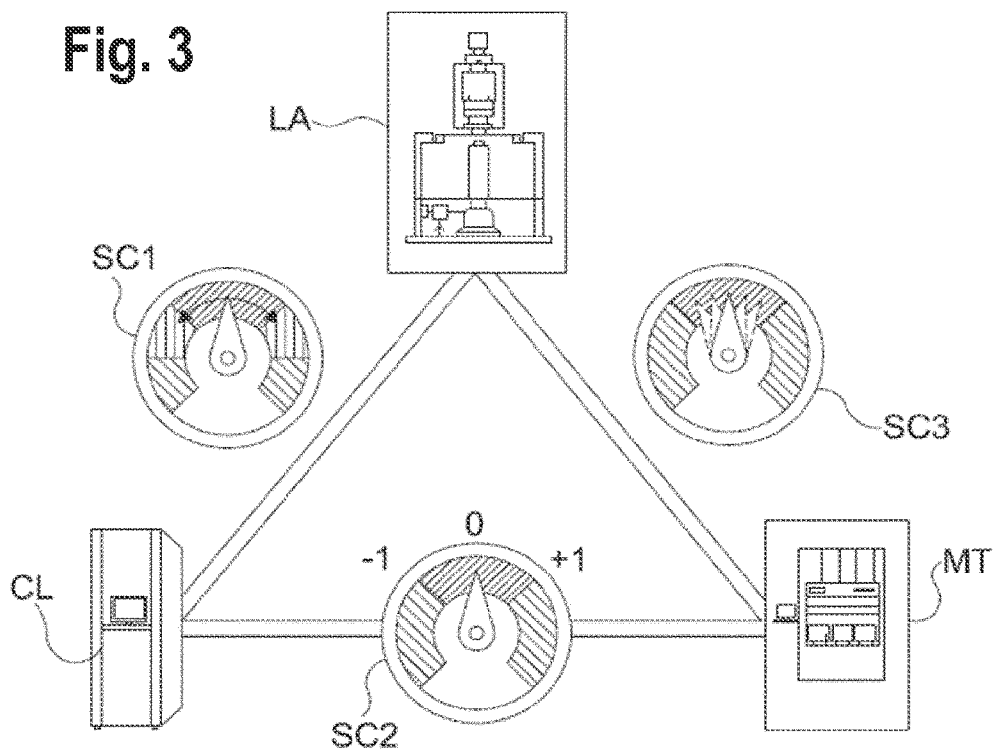
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As mentioned above, data obtained from a metrology tool may be used to determine properties of the exposed patterns. The data may relate to properties such as overlay, critical dimension, dose, focus, etc. The data may in turn be used to determine if there are exposure errors, based on one or more of the overlay, critical dimension, dose, or focus properties. Such errors may be caused by the settings of the apparatus, or they may be present on the substrate, for example as a result of imperfections on the wafer and/or the processes to prepare the wafer for exposure, or deposition of previous pattern layers. The measurement data may further be used to determine if adjustments can be made to the exposure recipes to improve future exposures of patterns on substrates, which may be the same or a different but substantially identical substrate, for example to remove or decrease the errors detected for the one or more properties. The recipe adjustments may also be referred to as corrections, which may apply to a global exposure condition across the substrate, or a more localized exposure condition (e.g. across a small area on the substrate). The dimension of the area on the substrate which needs specific correction determines the extent to which the system can correct for measured errors in the one or more parameters. It is therefore desirable to increase the correction resolution in case it is expected that the dimension of areas on the wafer requiring specific correction is small. In an example a dimension of an area on the substrate associated with a functional block of a device measures $2*2$ mm$^2$. In order to provide corrections specific to said functional block a correction resolution at a sub-mm scale is required. The correction resolution that can be achieved may be influenced by properties of the radiation beam, and specifically may be dependent on one or more of the size and shape of the radiation beam irradiating the patterning device.

Figure 4:
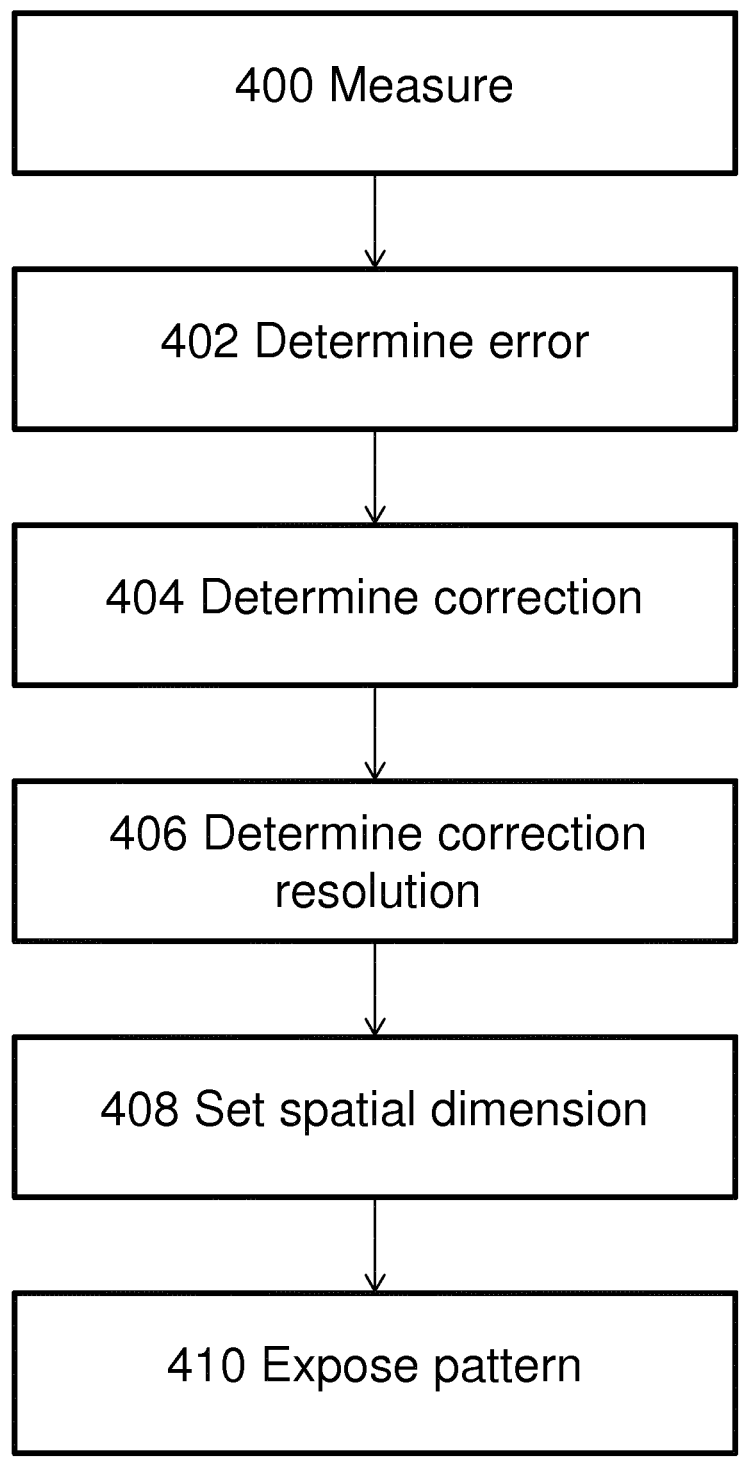
FIG. 4 depicts a flow diagram representing steps in a method for configuring a spatial dimension of a scanning beam.

According to the disclosure there are provided herein methods and apparatus to determine and set a spatial dimension of a radiation beam used to form a pattern on a substrate via exposure of a patterning device, based on the required spatial resolution of corrections to be applied to the exposure recipe. FIG. 4 shows steps in a method for determining a size of a spatial parameter of the radiation beam, set out in more detail below. In step 400 one or more properties of an exposed pattern are measured, as described above. In step 402 the system, for example the computer system CL, determines errors in one or more of the measured properties. In step 404 the system determines corrections to be applied to a subsequent exposure to remove or decrease these errors. In step 406 the highest resolution of the identified corrections to be applied is determined. In step 408 the spatial dimension of the radiation beam required to achieve this correction resolution is identified and is set in the apparatus. In step 410 the pattern is exposed using the set spatial dimension of the radiation beam. The resulting exposed pattern may be measured by the metrology apparatus to determine corrections and the process may be repeated.

The radiation beam B may be a beam of photons or particles. Such particles may for example be electrons, or ions. Radiation beam B may be incident on a patterning device MA. After passing through the patterning device, either in transmission or reflection, the radiation beam passes through a projection system PS, which focuses the beam onto the substrate W, which may be located on the substrate support table WT. In some instances, the patterning device MA and substrate W may be held stationary relative to each other while radiation beam B irradiates the entire patterning device so that it is exposed simultaneously. This mode of operation may be referred to as step mode. The irradiated pattern on patterning device is projected onto a target portion C of the substrate W in a single static exposure. After exposure of the pattern, the substrate W may be shifted relative to the patterning device MA, and the pattern may be exposed again onto a different target portion C' of the substrate W. In step mode, the maximum size of the target section C that can be exposed in a single static exposure by radiation beam B is determined by the exposure field limits.

In some instances, the radiation beam does not irradiate an entire patterning device simultaneously but instead scans across the pattering device to expose the pattern gradually. This mode of operation may be referred to as a scan mode. Scanning the radiation beam B across the patterning device, may be achieved by keeping the radiation beam stationary, and moving the patterning device MA relative to the beam. Substrate W may be moved synchronously with patterning device MA. Synchronized movement of patterning device MA and substrate W may take into account properties of the projection system PS, such as, for example, (de-)magnification and/or image reversal.

The scanning may be performed in a direction, which may be a linear direction. The linear direction perpendicular to the linear scanning direction may be referred to as the non-scanning direction. The radiation beam B may extend to cover the entire dimension of the patterning device MA in the non-scanning direction. The dimension of the radiation beam B in the scanning direction may be referred to as the length. The size and shape of a cross-section of the beam in a plane of the patterning device, when incident on the patterning device MA, may be referred to as a slit of radiation beam B.

The shape and size of the slit may be determined in an exposure slit area. Specifically, the exposure slit area may be used to determine the length of the slit. The exposure slit area may be located between the source of the radiation beam and the patterning device MA. Beam shaping actions affecting properties other than the slit length may be performed inside and/or outside the exposure slit area. Alternatively or additionally, radiation beam B shaping may be performed after the radiation beam B passes through the pattering device MA. The shape of the slit may be varied using beam shaping techniques and methods, and the resulting slit shape may include for example a square shape, a rectangular shape, or a trapezoidal shape. The size of the slit along the non-scanning direction in the plane of the patterning device may be of the order of cm, for example 3 cm. The slit length may be in the order of mm, for example 1 mm-10 mm, or 1 mm-20 mm. Required control of the slit length may be in the order of mm, for example selection of a slit length between 1 and 20 mm. Setting of the slit length may have a resolution in the order of 1 mm, or 0.1 mm. One or both of mechanical (e.g. beam block) and optical (e.g. beam shaping optics) methods and tools may be used to shape the beam to define the slit. The exposure slit area may be located in a plane in the radiation beam path, which may be a conjugate plane to the plane of the patterning device MA. A beam block located in the exposure slit area may be used to define the slit size and shape, blocking away areas of the beam so that only a portion of the beam cross-section, with a slit of a desired shape and size is obtained at the patterning device. The beam block may comprise one or more blades, which may be moveable blades which may be moved in and out of at least a portion of the path of the radiation beam, so as to block or unblock a portion of the radiation beam. The beam block may be located in a conjugate plane of the patterning device MA for radiation beam B, so that adjustments to the shape of the beam are translated to the slit in the plane of the patterning device MA. Alternatively or additionally, beam shaping optics may be used to set the shape and size of the beam. The exposure slit area determining the shape and size of the slit may comprise a three-dimensional region (e.g. a region containing the components of the beam shaping optics) along a portion of the propagation path of the radiation beam B. Compared to beam blocks, beam shaping optics have an advantage that they do not block away parts of the power of the radiation beam. However, beam blocks may be cheaper and easier to implement than beam shaping optics. In a lithographic apparatus as disclosed herein, the power provided by the source may be sufficient so that blocking a portion of the beam is acceptable and does not hinder the performance of the apparatus.

Computer system CL may be configured to determine corrections to be applied to an exposure recipe, based on measurements performed by the metrology system. The computer system CL may further be configured to determine the smallest spatial resolution of the determined corrections. Based on this determined smallest correction resolution, the computer system CL may determine to adjust one or more exposure parameters to achieve this resolution, and instruct the relevant exposure systems to apply the corrections to one or more subsequent exposures. Such systems may include for example, the parts of the lithographic apparatus configured to set the dose, focus, positioning, direction, size, and/or shape of the radiation beam. Applying the adjustments to the exposure may be achieved in a number of ways, for example, by using actuators to change the shape and/or size of the radiation beam so that corrections can be implemented during a scan irradiating the patterning device.

As mentioned above, one of the properties that may affect the achievable correction resolution of a system is the size and shape of the radiation beam B, and in particular the size and shape of the slit. The length of the slit may affect the resolution and mechanism of the corrections that can be achieved. If the length of the slit is large, large parts of the substrate are exposed at the same time, and corrections applied to the beam will affect large parts of the resulting exposed pattern. Small corrections applied by a slit with a great length may be averaged out by the scan. The corrections applied to the recipe are convolved by the length of the slit scanning over the area where the correction is applied during exposure in scanning mode. In an example implementation, the computer system CL determines the dimensions of the smallest correction to be applied. Based on the scan speed, the computer system CL may determine the duration of the correction to be applied to the beam, for example that it the duration of the correction to be applied is 1 ms. The length of the slit and the scan speed further determine the duration for which a point on the patterning device is exposed to a portion of the radiation beam. If the slit length is large, for a set scan speed, the exposure time of a position on the substrate to be patterned will be longer than if for a same scan speed, the slit length was smaller. For a large slit length, the total exposure time may be, for example, 10 ms, or 30 ms. In the example case described here, the correction to a position applied for 1 ms may be averaged out by the remaining 9 ms of exposure of that position to remaining parts of the radiation beam B, and the correction will not have been successfully implemented. Furthermore, during the 1 ms in which the correction is applied, this correction was applied to an area on the substrate irradiated by the slit, which is an area that becomes larger as the length increases. Increasing the slit length therefore negatively affects the correction resolution due to the longer averaging effects of the scan, and increasing the area to which the correction is applied.

As disclosed herein, it is preferable that the resolution of the convolved correction approaches the resolution of the correction C to be applied. This may be achieved by setting a slit length S so that $S^2+C^2<aC^2$, wherein a is a scalar number, larger than and approaching 1. In an example, the correction dimension C is 1 mm, and the maximum allowable value for a is set to 1.1. This chosen value of a determines the corresponding maximum allowable slit length under those conditions to be $aC^2-C^2>S^2$, therefore S must be smaller than $\sqrt{0.1}\approx 0.3$ mm to meet the requirement set by the chosen a, for the determined correction C=1 mm. For a known set of values of C and S, the resulting lowest value of a can be seen as a relative measure for how achievable the correction C is for that slit length S.

Decreasing the length of the slit means that a smaller area of the substrate to be patterned is exposed at any one time, meaning that a correction applied to the beam irradiates a smaller area. As a result, the correction applied to the beam is applied to a smaller area. Furthermore, if the length of the beam is smaller, the length of time for which any one position of the substrate is exposed is decreased, meaning that a correction can be applied for a shorter amount of time without being averaged out by the remainder of the beam scan. A correction to a radiation beam, with a shorter area of exposure and a shorter duration, can be applied to a smaller area on the patterned substrate, therefore increasing the resolution of achievable corrections to be applied.

As described herein, some embodiments are concerned with the choice of length of the slit, wherein this choice may influence the productivity and quality of the resulting exposed pattern. Advantages of short slit length include the ability to apply a higher resolution of corrections, resulting in higher accuracy of the exposure. Advantages of a greater slit length include the possibility to have a higher productivity compared to a smaller length, as larger areas of the pattern are exposed at the same time. A further advantage of a larger length is the averaging out of dose variations within the slit to achieve a more even exposure and increased dose control.

Figure 5A:
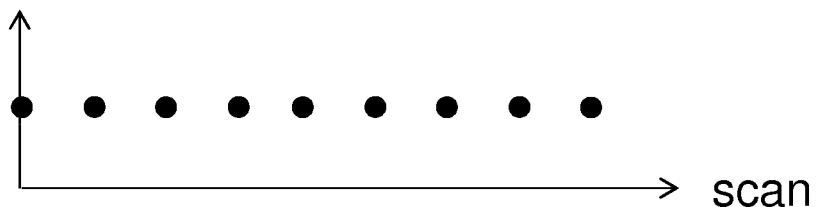
FIGS. 5a, 5b and 5c depict illustrations of example overlay errors to be corrected.
Figure 5B:
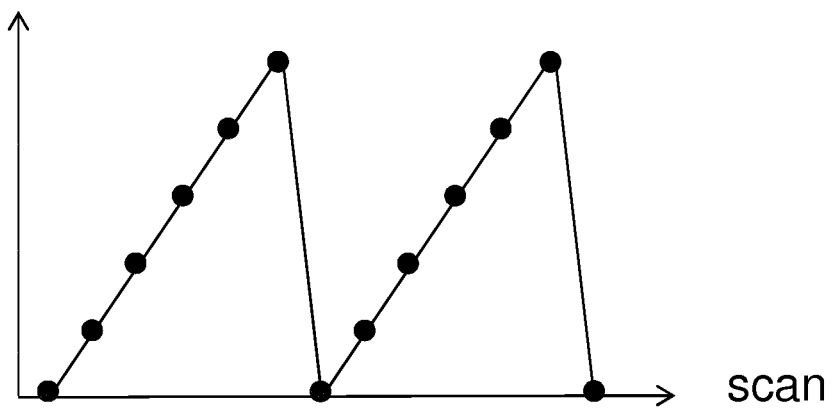
Figure 5C:
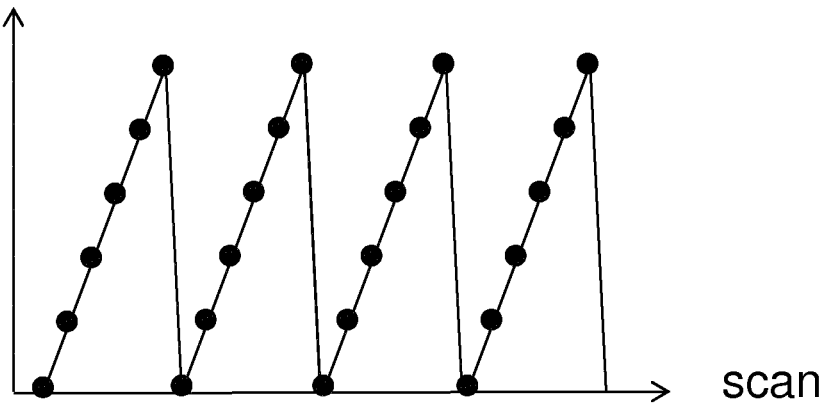

The effects of slit length variations will now be described in more detail in relation to an example for correcting an overlay error, as illustrated in FIGS. 5a 5b, and 5c. The horizontal axis represents a scanning direction of the beam along a patterning device. The vertical axis represents overlay error of an exposed pattern on a substrate in the scanning direction. Both axes are expressed in arbitrary units. In FIG. 5a, the example overlay error is constant along the scanning direction. In order to correct for this constant error, an adjustment may be implemented to the recipe that is constant along the scan. As the same adjustment is applied along every point of the scanning direction, the ability to implement this correction will not be limited by the slit length. In fact, a larger slit length may be beneficial to increase throughput, and average out dose variations within the slit.

In FIG. 5b, the example overlay error is not constant along the scan direction, and instead possesses a periodicity, changing linearly along the scanning direction. As set out above, the slit length will affect the resolution of corrections. FIG. 5c also shows a periodic, linearly changing overlay error along the scanning direction. Compared to FIG. 5b, the example error of FIG. 5c has a higher rate of change of the overlay error, which means a high resolution correction to address this is needed. The maximum slit length able to achieve the corrections for FIG. 5c is smaller than the maximum slit length able to achieve the corrections for FIG. 5b. The example errors of FIGS. 5b and 5c have a linearly changing profile. However, the method and apparatus disclosed herein deal with the spatial dimensions of corrections to be applied to an exposure. Other, non-linear error profiles can therefore also be handled using the methods and apparatus described above.

The structures deposited on a substrate during lithographic exposure may have dimensions in the order of nanometers or micrometers. In order to increase fabrication throughput of the lithographic process, a plurality of these structures may be located on the same patterning device MA, and patterned during the same exposure. On a patterning device, a structure or set of structures separate from the other structures on the patterning device MA may be referred to as a die. An example size of a die on a patterning device are 10 mm×10 mm (100 mm$^2$), but die sizes may be bigger or smaller than these dimensions, and may have a square, rectangular, or other shape. The plurality of dies may be arranged in an array on the patterning device. Each die comprises a pattern that may be independent of the other dies on the patterning device. As the structures contained within a die may be different from the structures of other dies, the corrections to be applied may differ between dies. In order to be able to apply intra-die corrections, that is to say, to apply different corrections to different dies, the slit length may be at least as small so as to achieve a correction resolution smaller than the dimension of a die in the scanning direction.

Instead or in addition to providing a small enough slit length to allow intra-die corrections it is proposed to improve the correctability of process parameters across the substrate by configuring the patterning device used in the patterning of the substrate.

Typically a patterning device comprises a plurality of functional areas comprising (product) features.

The functional areas may be associated with a certain functionality needed for a semiconductor device to perform, e.g. for example a first and a second functional area providing (cache) memory, a third functional area comprising a Graphic Process Unit (GPU) and a fourth functional area comprising logic to control said memory.

Alternatively the functional area may be associated with a die area comprising the product features of (a layer of) an entire functional semiconductor device. Each functional area is repeatedly provided to the patterning device. A patterning device may then comprise for example 6 functional areas (dies); 3 dies along the scanning direction across the patterning device and 2 dies along a direction perpendicular to the scanning direction.

In many cases the distribution of features across a functional area is affecting a characteristic of a process performed subsequently to the exposure step of the patterning device. For example the density of features across the functional area may vary along the scanning direction, having a pronounced impact of the substrate topography after being subject to etching, deposition and polishing (CMP) steps. The topography being a height profile of the substrate across an exposure field on the substrate subject to the patterning process (performed by a lithographic apparatus).

Figure 6A:
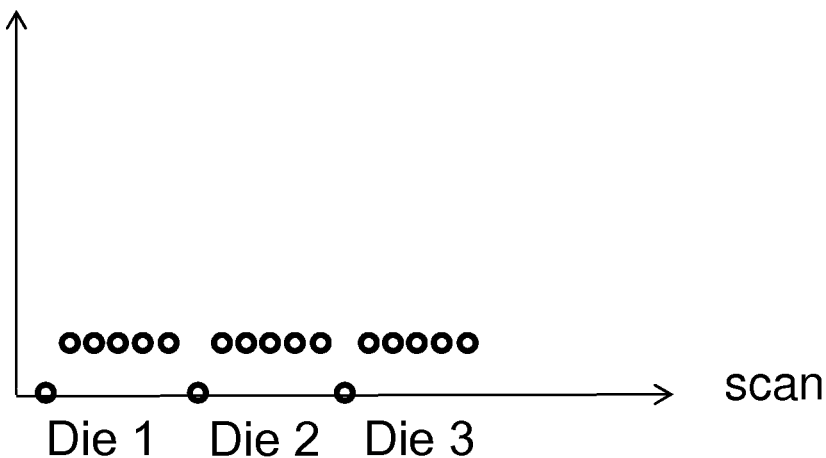
FIGS. 6a and 6b depict the effect of changing the orientation of a die with respect to neighbouring die on the fingerprint of a focus parameter along a direction of scanning.

In FIG. 6a an example is given of 3 identical dies which are oriented in head-tail configuration along the scanning direction. Each die has an associated layout of features causing a focus profile along the scanning direction as indicated by the expected focus values associated with the (per die) six measurement points (dots in the graph). In the example depicted by FIG. 6a, the left points for each die are associated for example by periphery structures of the die and the five points next to the periphery are associated with the cell structures of the dies.

It is clear from FIG. 6a that between the dies a steep gradient of the focus profile occurs. For example the step in focus between die 1 and die 2 may be as much as 100 nm across as little as 1 mm translation along the scan direction. In particular for 3D NAND manufacturing processes involving deposition, etching and polishing of thick layers these between die focus steps may be of considerable magnitude.

A lithographic apparatus used in a subsequent lithographic process step may not be equipped to accurately control the focus of the substrate while scanning the patterning device in case the focus step is too large and/or occurs within a too small spatial scale.

It is proposed to configure the patterning device such that the positions of the features within a functional area (being a die or a functionally defined area of a semiconductor device) are chosen in accordance with an expected spatial scale of a characteristic of the process performed subsequent to the exposure of the patterning device. In particular the positions of the features within a functional area are chosen such that steps in focus, overlay, Edge Placement Error (EPE), Critical Dimension (CD) or dose are expected to occur at a spatial scale which is sufficiently correctable by the control facilities of the lithographic process.

In case the functional areas are dies an effective positioning of the features may be achieved by rotating or mirroring an existing layout of the features for a selection of one or more dies.

Figure 6B:
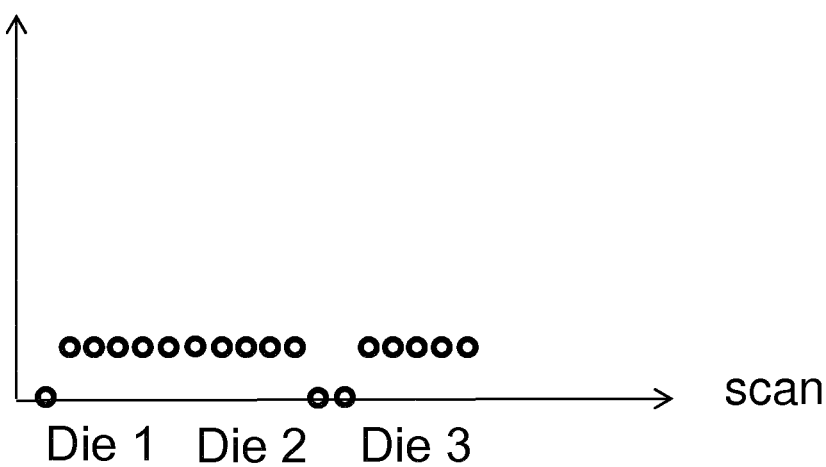

FIG. 6b depicts the expected focus profile in case the second die (die 2) has a rotated (180 degree rotating across centre) or mirrored layout of features with respect to die 1 and die 3. As can be derived from FIG. 6b, there is not any longer a focus step between the dies, only within each die there is a focus step (due to difference for example between periphery and cell structures). Furthermore the spatial scale along which the focus step between die 2 and die 3 occurs (along scan direction) has doubled in comparison to the initial focus step associated with the initial feature layout of die 2 (FIG. 6a). This doubling effectively reduces the gradient of focus variations between dies, which makes the focus step more easy to be corrected by focus control systems comprised within the scanning lithographic apparatus.

In an embodiment a patterning device comprises a plurality of functional areas characterized in that a layout of features associated with a first functional area is mirrored and/or rotated compared to a layout of features associated with a second functional area adjacent to the first functional area.

The examples given so far, in particular as depicted in FIGS. 6a and 6b, disclose specific embodiments of a generic concept of distributing features across at least one functional areas based on an expected dependency of a spatial characteristic of a subsequent process on the positions of the features.

The distribution of features (e.g. the positions of the features) across the functional area is typically defined during the design process of the patterning device. Empirical or physical models of process steps such as polishing, etching and deposition of layers known in the art of semiconductor manufacturing may be used to predict the spatial characteristic given a certain feature layout (e.g. configuration of feature positions). Subsequently to the determining of the positions of the features comprised within the at least one functional area the patterning device may be manufactured by providing the features (typically using a lithographic process) to the substrate of the patterning device.

Furthermore the feature distribution across the at least one functional area may be determined in combination with selection of a spatial dimension of the beam used in patterning of the substrate. Positioning of the features across the functional area may for example be based on an existing layout of features across the functional area and updated only when it is determined that a spatial resolution of a patterning correction is not sufficiently high to provide a yielding semiconductor device using the lithographic process. The updated positions of the features may then be determined based on for example rotation of the existing layout of features such that the spatial resolution of the spatial characteristic of the process performed subsequently to the lithographic process does not exceed correction capabilities.

In an embodiment positions of features within a functional area on the patterning device are at least partially based on a spatial resolution of a patterning correction and a spatial characteristic of a process performed subsequently to the exposing of the pattern onto the substrate.

In an embodiment positions of features across a functional area on a patterning device configured for use in a lithographic process are determined based at least partially on the dependency of a spatial characteristic of a process performed subsequently to the lithographic process on the positions of the features.

In an embodiment the patterning device comprises a plurality of functional areas, each functional area representing an individual die.

In an embodiment the positions of the features within the functional area are determined by rotation of a layout of the features associated with another functional area on the patterning device.

In an embodiment the rotation is a rotation of 180 degrees around the center of the functional area.

In an embodiment the positions of the features within the functional area are determined by mirroring a layout of the features associated with another functional area on the patterning device.

In an embodiment the mirroring is defined with respect to an axis of symmetry of the another functional area.

In an embodiment the axis of symmetry is perpendicular to a direction of scanning of a lithographic apparatus used in the lithographic process.

In an embodiment the process performed subsequent to the lithographic process is a second lithographic process and the spatial characteristic is a control capability of a parameter associated with the second lithographic process.

In an embodiment the parameter associated with the second lithographic process is one of: focus, Critical Dimension, overlay, Edge Placement Error, dose.

In an embodiment the process performed subsequent to the lithographic process is an etching or deposition process and the spatial characteristic is a topography of a substrate after being subject to the lithographic process and the etching or deposition process.

In an embodiment a patterning device is manufactured based on the determined positions of the features across at least one functional area according to any suitable embodiment for determining said positions.

In an embodiment a patterning device comprises features positioned within a functional area using the method of manufacturing the patterning device.

In an embodiment a preferred orientation of a die with respect to another die on a patterning device configured for use in a process of patterning a substrate is determined, the method comprising determining the preferred orientation of the die based on a topography of the substrate after executing the process of patterning the substrate.

In an embodiment the patterning device is configured for use in a process of producing 3D NAND devices.

In an embodiment the topography is associated with a height profile across one or more die areas on the substrate.

In an embodiment the preferred orientation of the die is associated with a height profile of the substrate which is correctable by an available focus control mechanism of the patterning process.

Further embodiments of the invention are disclosed in the list of numbered clauses below:

1. A method of configuring a step of scanning a beam of photons or particles across a patterning device for exposing a pattern onto a substrate, the method comprising:
    determining a spatial resolution of a patterning correction configured to improve quality of the exposing; and
    determining a spatial dimension of the beam based on the determined spatial resolution of the patterning correction.

2. The method according to clause 1 wherein the configuring of the step is undertaken in a lithographic apparatus.

3. The method according to clause 2, wherein the patterning correction comprises a correction to mitigate the effects of one or more of alignment, overlay, critical dimension, dose and focus.

4. The method according to any preceding clause, wherein the patterning correction is determined based on one or more measurements undertaken on a further substrate.

5. The method according to any preceding clause wherein a beam cross-section defines a slit at the patterning device.

6. The method according to clause 5 wherein the beam is passed through an exposure slit area for forming the shape of the slit.

7. The method according to any of clauses 5 or 6, wherein the spatial dimension of the beam is associated with a length of the slit in a direction of the scanning.

8. The method according to clause 1, wherein the spatial dimension of the beam is indirectly proportional to the spatial resolution of the patterning correction.

9. The method according to clause 7 wherein the length of the slit S and the spatial resolution C of the patterning correction are related according to $S^2+C^2 \le 1.1\ C^2$.

10. The method according to any preceding clause, wherein the patterning device comprises a plurality of dies to be exposed to the substrate at a plurality of locations, and wherein the spatial resolution of the patterning correction is smaller than a dimension of a die of the plurality of dies.

11. The method according to any preceding clause, wherein the patterning device comprises a mask or reticle.

12. The method according to any preceding clause, wherein the spatial dimension of the beam is controlled by a beam block.

13. The method according to clause 12, wherein the beam block comprises a plurality of moveable blades.

14. A method according to clause 13, wherein the patterning device is located at an image plane of the beam, and wherein the beam block is located in a conjugate plane of the image plane.

15. The method according to any preceding clause, wherein the spatial dimension of the beam is adjusted using variable beam shaping optics.

16. The method according to any preceding clause further comprising scanning the beam across the patterning device to expose the pattern onto the substrate.

17. The method according to clause 16, further comprising adjusting one or more properties of the beam to apply the patterning correction during scanning of the beam across the patterning device.

18. The method according to clause 16 or 17, wherein scanning the beam across the patterning device comprises moving one of the patterning device and the beam relative to the other of the patterning device and the beam.

19. An electronic data carrier comprising instructions which, when executed on at least one processor, cause the at least one processor to control an apparatus to carry out a method according to any of clauses 1-18.

20. An apparatus for configuring a step of scanning a beam of photons or particles across a patterning device for exposing a pattern onto a substrate, the apparatus comprising a processor configured to execute computer program code to undertake the method of:
    determining a spatial resolution of a patterning correction configured to improve quality of the exposing; and
    determining a spatial dimension of the beam based on the determined spatial resolution of the patterning correction.

21. An apparatus for use in semiconductor manufacture comprising the apparatus of clause 20.

22. A lithographic cell system comprising the apparatus for use in semiconductor manufacture of clause 21.

23. Apparatus configured to:
    obtain measurement data relating to one or more properties of a pattern exposed on a substrate;
    determine a spatial resolution of a patterning parameter of the pattern based on the measurement data; and
    determine a spatial dimension of a beam of photons or particles of a patterning device, based on the determined spatial resolution.

24. An apparatus for use in semiconductor manufacture comprising the apparatus of clause 23.

25. A lithographic cell system comprising the apparatus for use in semiconductor manufacture of clause 24.

26. A method for determining positions of features within a functional area on a patterning device configured for use in a lithographic process, the method comprising: determining positions of the features within the functional area based at least partially on the dependency of a spatial characteristic of a process performed subsequently to the lithographic process on the positions of the features.

27. The method of clause 26, wherein the patterning device comprises a plurality of functional areas, each functional area representing an individual die.

28. The method of clause 26 or 27, wherein the positions of the features within the functional area are determined by rotation of a layout of the features associated with another functional area on the patterning device.

29. The method of clause 28, wherein the rotation is a rotation of 180 degrees around the center of the functional area.

30. The method of clause 26 or 27, wherein the positions of the features within the functional area are determined by mirroring a layout of the features associated with another functional area on the patterning device.

31. The method of clause 30, wherein the mirroring is defined with respect to an axis of symmetry of the another functional area.

32. The method of clause 31, wherein the axis of symmetry is perpendicular to a direction of scanning of a lithographic apparatus used in the lithographic process.

33. The method of any of clauses 26 to 32, wherein the process is a second lithographic process and the spatial characteristic is a control capability of a parameter associated with the second lithographic process.

34. The method of clause 33, wherein the parameter is one of: focus, Critical Dimension, overlay, Edge Placement Error, dose.

35. The method of any of clauses 26 to 32, wherein the process is an etching or deposition process and the spatial characteristic is a topography of a substrate after being subject to the lithographic process and the etching or deposition process.

36. A patterning device comprising features positioned within the functional area using a method according to any of clauses 26 to 35.

37. A method of manufacturing a patterning device, the method comprising a step of applying features within a functional area on the patterning device, wherein the features are positioned according to a method of any of clauses 26 to 35.

38. A device manufacturing process comprising a step of patterning substrates using a patterning device according to clause 36.

39. A method for determining a preferred orientation of a die with respect to another die on a patterning device configured for use in a process of patterning a substrate, the method comprising determining the preferred orientation of the die based on a topography of the substrate after executing the process of patterning.

40. The method of clause 39, wherein the patterning device is configured for use in a process of producing 3D NAND devices.

41. The method of clause 39, wherein the topography is associated with a height profile across one or more die areas on the substrate.

42. The method of clause 41, wherein the preferred orientation of the die is associated with a height profile which is correctable by an available control mechanism of the patterning process.

43. The method of any of clauses 1 to 25, further comprising configuring the patterning device by positioning features within a functional area on the patterning device at least partially based on the spatial resolution of the patterning correction and/or a spatial characteristic of a process performed subsequently to the exposing of the pattern onto the substrate.

44. A patterning device comprising a plurality of functional areas characterized in that a layout of features associated with a first functional area is mirrored and/or rotated compared to a layout of features associated with a second functional area adjacent to the first functional area.

45. The patterning device of clause 44, wherein the layout of features associated with the first functional area is mirrored with respect to an axis of symmetry of the first functional area compared to the layout of features associated with the second functional area.

46. The patterning device of clause 44, wherein the layout of features associated with the first functional area is rotated across a center of the first functional area compared to the layout of features associated with the second functional area.

47. The patterning device of any of clauses 44 to 46, wherein the functional areas are dies.

48. The patterning device of any of clauses 44 to 47, wherein the patterning device is configured for use in a 3D NAND manufacturing process.

49. The method of clause 1, wherein the patterning device is according to the patterning device of any of clauses 36 or 44 to 48.

The methods and apparatus described herein may be used for lithographic manufacturing of integrated circuits, which may for example be 3D NAND structures.

The methods described herein may be in the form of instructions comprised on an electronic data carrier. An electronic data carrier may comprise hardware, or downloadable and transmittable signals over a wired or wireless connectivity medium.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of configuring a step of scanning a beam of photons or particles across a patterning device for exposing a pattern onto a substrate, the method comprising:
   determining a spatial resolution of a patterning correction configured to improve quality of the exposing; and
   determining a spatial dimension of the beam based on the determined spatial resolution of the patterning correction, wherein the spatial dimension of the beam is indirectly proportional to the spatial resolution of the patterning correction.

2. The method according to claim 1, wherein the configuring of the step is undertaken in a lithographic apparatus.

3. The method according to claim 2, wherein the patterning correction comprises a correction to mitigate the effects of one or more selected from: alignment, overlay, critical dimension, dose and/or focus.

4. The method according to claim 1, wherein the patterning correction is determined based on one or more measurements undertaken on a further substrate.

5. The method according to claim 1, wherein a beam cross-section defines a slit at the patterning device.

6. The method according to claim 5, wherein the beam is passed through an exposure slit area for forming the shape of the slit.

7. The method according to claim 5, wherein the spatial dimension of the beam is associated with a length of the slit in a direction of the scanning.

8. The method according to claim 7, wherein the length of the slit S and the spatial resolution C of the patterning correction are related according to $S^2+C^2 \leq 1.1\ C^2$.

9. The method according to claim 1, wherein the patterning device comprises a plurality of dies to be exposed to the substrate at a plurality of locations, and wherein the spatial resolution of the patterning correction is smaller than a dimension of a die of the plurality of dies.

10. The method according to claim 1, wherein the patterning device comprises a mask or reticle.

11. The method according to claim 1, wherein the spatial dimension of the beam is controlled by a beam block.

12. The method of claim 1, further comprising configuring the patterning device by positioning features within a functional area on the patterning device at least partially based on the spatial resolution of the patterning correction.

13. A non-transitory electronic data carrier comprising instructions therein, the instructions, when executed on at least one processor, cause the at least one processor to at least:
   determine a spatial resolution of a patterning correction configured to improve quality of exposing a pattern onto a substrate, the exposing using a step of scanning a beam of photons or particles across a patterning device; and
   determine a spatial dimension of the beam based on the determined spatial resolution of the patterning correction, wherein the spatial dimension of the beam is indirectly proportional to the spatial resolution of the patterning correction.

14. The carrier of claim 13, wherein a beam cross-section defines a slit at the patterning device and the spatial dimension of the beam is associated with a dimension of the slit.

15. The carrier of claim 14, wherein the dimension of the slit is a length of the slit, and wherein the length of the slit S and the spatial resolution C of the patterning correction are related according to $S^2+C^2 \leq 1.1\ C^2$.

16. The carrier of claim 13, wherein the patterning device comprises a plurality of dies to be exposed to the substrate at a plurality of locations, and wherein the spatial resolution of the patterning correction is smaller than a dimension of a die of the plurality of dies.

17. The carrier of claim 13, wherein the instructions are further configured to cause the at least one processor to configure a pattern of the patterning device by positioning features within a functional area on the patterning device at least partially based on the spatial resolution of the patterning correction.

18. The carrier of claim 13, wherein the patterning correction comprises a correction to mitigate the effects of one or more selected from: alignment, overlay, critical dimension, dose and/or focus.

19. The carrier of claim 13, wherein the patterning device comprises a mask or reticle.

20. An apparatus for configuring a step of scanning a beam of photons or particles across a patterning device for exposing a pattern onto a substrate, the apparatus comprising computer code and a processor configured to execute the computer program code to cause the apparatus to at least:
   determine a spatial resolution of a patterning correction configured to improve quality of the exposing; and
   determine a spatial dimension of the beam based on the determined spatial resolution of the patterning correction, wherein the spatial dimension of the beam is indirectly proportional to the spatial resolution of the patterning correction.

* * * * *